(12) United States Patent
Oba et al.

(10) Patent No.: US 7,525,282 B2
(45) Date of Patent: Apr. 28, 2009

(54) BATTERY-OPERATED EQUIPMENT INCLUDING A MICROCOMPUTER

(75) Inventors: Takafumi Oba, Kusatsu (JP); Mikihiro Yamashita, Echi-gun (JP)

(73) Assignee: Matsushita Electric Works, Ltd, Osaka (JP)

( * ) Notice: Subject to any disclaimer, the term of this patent is extended or adjusted under 35 U.S.C. 154(b) by 416 days.

(21) Appl. No.: 11/359,389

(22) Filed: Feb. 23, 2006

(65) Prior Publication Data

US 2006/0192532 A1 Aug. 31, 2006

(30) Foreign Application Priority Data

Feb. 28, 2005 (JP) .............................. 2005-054250

(51) Int. Cl.
*H01M 10/46* (2006.01)
(52) U.S. Cl. ..................................... 320/107
(58) Field of Classification Search .................. 320/107, 320/128, 141
See application file for complete search history.

(56) References Cited

U.S. PATENT DOCUMENTS

| | | | | |
|---|---|---|---|---|
| 5,606,242 A | * | 2/1997 | Hull et al. ..................... | 320/106 |
| 5,994,878 A | * | 11/1999 | Ostergaard et al. ........... | 320/132 |
| 6,265,848 B1 | * | 7/2001 | Mukainakano ............... | 320/132 |
| 2003/0122523 A1 | * | 7/2003 | Kim et al. .................... | 320/112 |

FOREIGN PATENT DOCUMENTS

| | | |
|---|---|---|
| DE | 35 35 118 | 4/1987 |
| DE | 198 28 927 | 1/2000 |
| JP | 6-27206 | 2/1994 |
| JP | 7-325633 | 12/1995 |
| JP | 09-322416 | 12/1997 |
| JP | 2002-051475 | 2/2002 |
| JP | 2004-239748 | 8/2004 |
| WO | WO 01/56008 | 8/2001 |

OTHER PUBLICATIONS

Japanese Official Action dated Apr. 30, 2008, issued in JP2006-047488.
Extended European Search Report dated Jun. 30, 2006, 3 pages.

* cited by examiner

*Primary Examiner*—Edward Tso
(74) *Attorney, Agent, or Firm*—Edwards Angell Palmer & Dodge LLP

(57) ABSTRACT

A battery-operated equipment comprises a battery; a constant voltage power source that derives a constant voltage from a battery voltage across the battery; and a microcomputer that incorporates an A/D converter(s) and has terminals for the A/D converter and a power input terminal. The microcomputer is connected with the battery via the power input terminal to use the battery voltage as its power source voltage. The converter is connected with the constant voltage power source via a specific terminal of the terminals for the converter to use the constant voltage as a voltage for the converter.

8 Claims, 4 Drawing Sheets

BATTERY-OPERATED EQUIPMENT INCLUDING A MICROCOMPUTER

TECHNICAL FIELD

The invention relates to battery-operated equipments that use batteries as their power source to drive loads and more particularly a battery-operated equipment including a micon (microcomputer) that incorporates an A/D converter(s).

BACKGROUND ART

For example, this kind of battery-operated equipment is generally equipped with a micon in order to realize multifunction, when incorporated in an electrical shaver, a portable telephone or the like.

An electronic device described as a prior art in Japanese Laid-open Patent Publication No. H07-325633 is constructed with a battery, a regulator (3-terminal regulator) connected with the battery, and a main circuit that includes a micon (CPU) and is connected with the output of the regulator. In the electronic device, the regulator derives a constant voltage from a battery voltage across the battery to supply the main circuit with the constant voltage as an operating power source. Generally, the constant voltage as an output voltage of the regulator is lower than the battery voltage as its input voltage due to operating efficiency (loss on regulating) of the regulator. On account of this, when the battery voltage falls and the difference between the battery voltage and the constant voltage becomes small, there are cases where, even if the battery voltage is higher than a minimum operation voltage of the main circuit, the constant voltage becomes lower than the minimum operation voltage. In such cases, since the main circuit cannot operate in spite of the situation that the battery can, by itself, supply the battery voltage higher than the minimum operation voltage, it is necessary to exchange the battery for a new one or to recharge the battery.

A battery-operated equipment described in Japanese Laid-open Patent Publication No. H07-325633 includes a battery, a regulator and a main circuit as well as the above-described electronic device, and further includes a detection circuit and a changeover circuit. The detection circuit detects an output voltage of the regulator. The changeover circuit connects an output of the battery or an output of the regulator to the main circuit according to a control signal from the main circuit. The main circuit is provided with a control circuit (micon) that issues the control signal to the changeover circuit based on the output voltage detected by the detection circuit. Namely, when a value of the output voltage is within a specified value range of the main circuit, the control circuit issues a LOW signal (as the control signal) for switching a power source for the main circuit to the output of the regulator. Inversely, when a value of the output voltage is lower than the specified value range, the control circuit issues a HIGH signal (as the control signal) for switching the power source for the main circuit to the output of the battery. According to this configuration, since the power source for the main circuit is switched to the output of the battery if a value of the output voltage detected by the detection circuit is lower than the specified value range, it is possible to extend usable time of the equipment without exchange of the battery or recharge of the battery in comparison with the way that only output of the regulator is used as the power source for the main circuit.

However, since the above conventional battery-operated equipment requires the changeover circuit, its circuit configuration becomes complicated. Also, since the battery-operated equipment stops the operation of the regulator after the power source for the main circuit is switched to the output of the battery, it is unable to use an A/D converter(s) incorporated in the micon. This is because a reference voltage used by the A/D converter cannot be derived from the regulator.

DISCLOSURE OF THE INVENTION

An object of the present invention is to make it possible to use an A/D converter(s) incorporated in a micon without complicating circuit configuration of battery-operated equipments in addition to extending their usable time.

A battery-operated equipment of the present invention comprises a battery; a constant voltage power source that derives a constant voltage from a battery voltage across the battery; and a microcomputer that incorporates at least an A/D converter and has terminals for the A/D converter and a power input terminal. The microcomputer is connected with the battery via the power input terminal to use the battery voltage as its power source voltage. The A/D converter is connected with the constant voltage power source via a specific terminal of the terminals for the A/D converter to use the constant voltage as a voltage for the A/D converter.

In one aspect of the present invention, the A/D converter is connected with the constant voltage power source via its reference voltage input terminal as the specific terminal to use the constant voltage as a reference voltage for its A/D conversion.

In another aspect of the present invention, the microcomputer has an analog input terminal of the A/D converter as the specific terminal and also has a reference voltage input terminal of the A/D converter as another terminal of the terminals for the A/D converter. The A/D converter is connected with the constant voltage power source via the analog input terminal to use the constant voltage as an input voltage for its A/D conversion and also connected with the battery via the reference voltage input terminal to use the battery voltage as a reference voltage for its A/D conversion.

The present invention may further comprise an indication circuit that indicates operating state of the battery-operated equipment according to control of the microcomputer. The microcomputer further has a control terminal. The indication circuit is connected with the control terminal to receive the control and also connected with the battery to use the battery voltage as its power source voltage.

The present invention may further comprise a motor that is connected with the battery to use the battery voltage as its power source voltage.

In other aspect of the present invention, the battery is a secondary battery; and the constant voltage power source increases and decreases the constant voltage on charging and discharging of the battery, respectively.

BRIEF DESCRIPTION OF THE DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION

Figure 1:
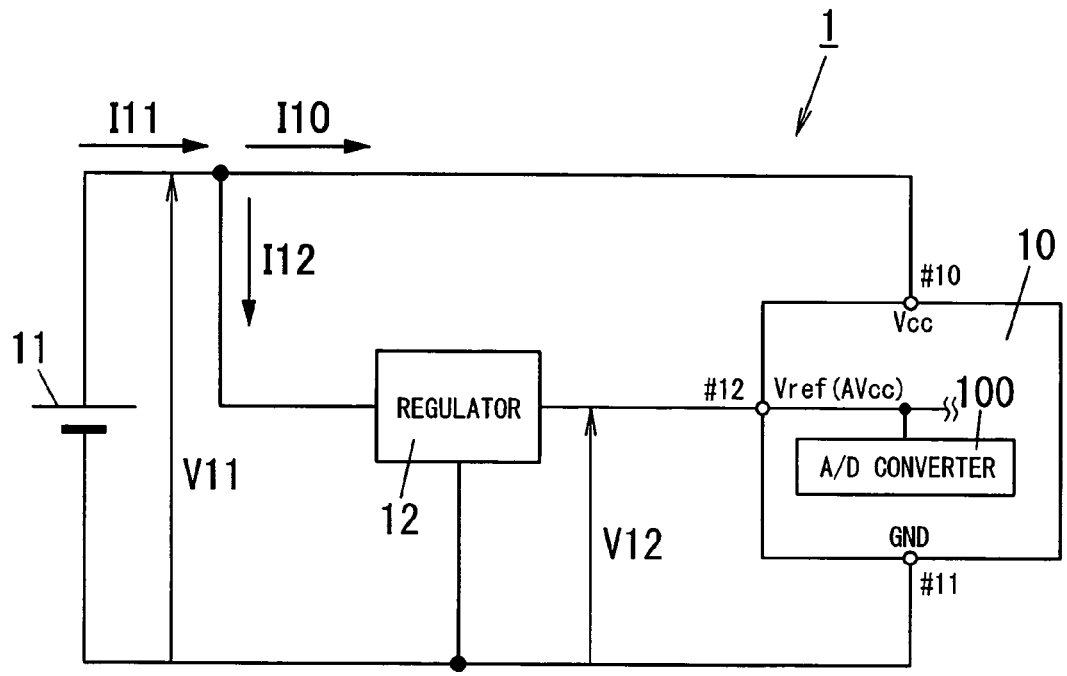
FIG. 1 is a schematic diagram of a battery-operated equipment of a first embodiment according to the invention.

FIG. 1 shows a battery-operated equipment 1 of a first embodiment according to the invention. As shown in FIG. 1, the battery-operated equipment 1 is an equipment (e.g., electrical shaver, portable telephone, etc.) including a micon 10, and further includes a battery 11 and a regulator 12.

The battery 11 is, for example, a secondary battery (rechargeable battery) but, not limited to this, may be a primary battery (disposable battery). The regulator 12 is, for example, a 3-terminal regulator that derives a constant voltage V12 from a battery voltage V11 (V11>V12) across the battery 11.

The micon 10 incorporates at least an A/D converter 100 and has terminals such as a power input terminal #10, a GND terminal #11, terminals for the A/D converter and so on.

The A/D converter 100 is connected with a positive output terminal of the regulator 12 via a specific terminal of the terminals for the A/D converter 100 to use the constant voltage V12 as a voltage for the A/D converter 100. In the first embodiment, the A/D converter 100 is connected with the positive output terminal of the regulator 12 via a reference voltage input terminal #12 (e.g., power source terminal AVcc for internal analog circuit) as the specific terminal to use the constant voltage V12 as a reference voltage Vref for its A/D conversion.

The micon 10 is respectively connected with a positive terminal and a negative terminal of the battery 11 via the terminals #10 and #11 to use the battery voltage V11 as its power source voltage for operation (Vcc), and performs various processes according to a program stored in a memory (not shown) on the operation. For example, the micon 10 acquires digital data of current through a load (e.g., motor, etc.) of the equipment 1 (e.g., electrical shaver, etc.), battery voltage V11 or the like from the A/D converter 100, and then performs drive control of the load based on the digital data.

In FIG. 1, I11 becomes the sum of I10 and I12 wherein I11 is current consumption in the battery 11, I10 is current consumption in the micon 10 and I12 is current consumption in the regulator 12. Accordingly, in comparison with the above-described electronic device (prior art), the current consumption in the regulator 12 is reduced by the current consumption in the micon 10. The operating efficiency of a general regulator falls as its input current increases, and therefore in the prior art, the input voltage of its regulator must be higher than the output voltage of the regulator. In the first embodiment, since the current consumption in the regulator 12 is reduced, the regulator 12 can produce the constant voltage V12 up to battery voltage lower than that of the prior art. As a result, the micon 10 can use the A/D converter 100 up to battery voltage lower than that of the prior art.

According to the first embodiment, the battery voltage V11 is used as the power source voltage Vcc of the micon 10 and the constant voltage V12 is used as the reference voltage Vref for the A/D conversion, and therefore the micon 10 can drive the load while using the A/D converter 100 without the influence of the operating efficiency of the regulator 12 until the battery voltage V11 falls to the lower limit of the operating voltage range (a minimum operation voltage) of the micon 10. Moreover, since the detection circuit and the changeover circuit in the above-described conventional battery-operated equipment are not required, it is possible to use the A/D converter 100 incorporated in the micon 10 without complicating the circuit configuration of the battery-operated equipment 1 in addition to extending its usable time.

Figure 2:
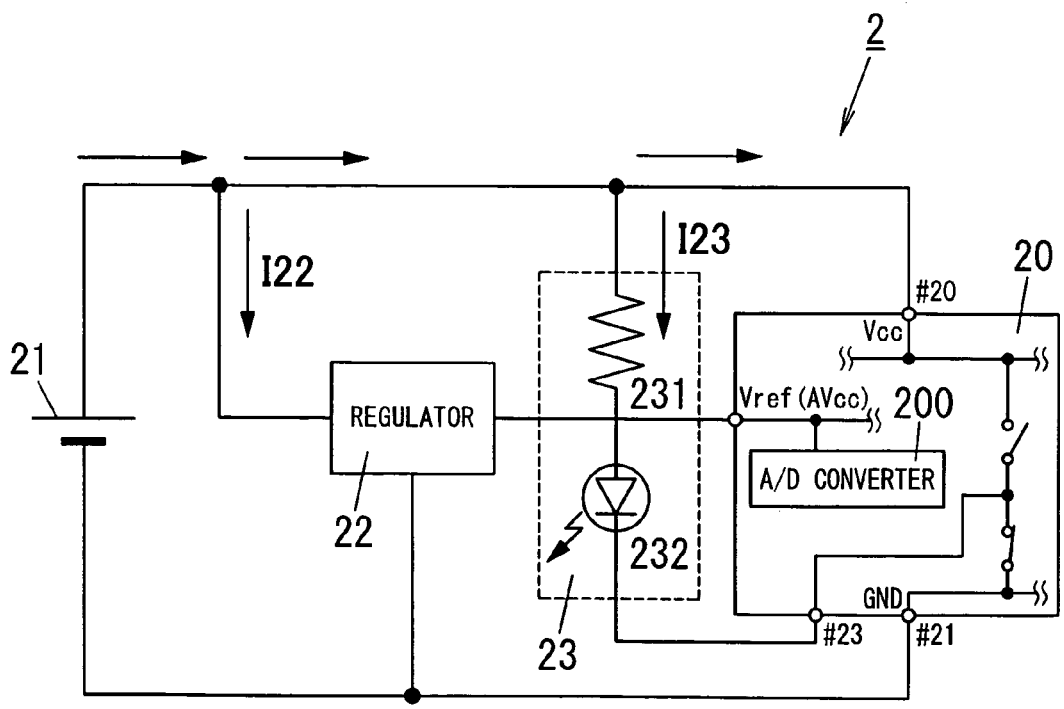
FIG. 2 is a schematic diagram of a battery-operated equipment of a second embodiment according to the invention.

FIG. 2 shows battery-operated equipment 2 of a second embodiment according to the invention. As shown in FIG. 2, the battery-operated equipment 2 includes a micon 20, a battery 21 and a regulator 22 in almost the same way those of the first embodiment, and further includes an indication circuit 23. In addition, a terminal #23 that turns ON (GND) and OFF (Vcc) according to control of the micon 20 is selected from terminals of the micon 20, and the terminal #23 is used as a control terminal for controlling the indication circuit 23.

The indication circuit 23 is configured to indicate operating state of the battery-operated equipment 2 according to the control of the micon 20. For example, the circuit 23 is constructed with a current-limiting resistor 231 of which one end is connected with a positive terminal of the battery 21, and a LED (light emitting diode) 232 connected between another end of the resistor 231 and the control terminal #23. In this configuration, when the control terminal #23 is internally connected with GND (#21) to turn ON, the battery voltage of the battery 21 is applied across the indication circuit 23 and then the LED 232 emits light. Inversely, when the control terminal #23 is internally connected with Vcc (#20) to turn OFF, the LED 232 is extinguished. However, not limited to this, the indication circuit 23 may be a LCD (liquid crystal display) or the like.

When the above-described electronic device (prior art) is mounted with an indication circuit like above one, there exists two configurations. One configuration is that the indication circuit is connected between the output of the regulator and a control terminal of the micon in the main circuit. In this configuration, since current consumption in the regulator is increased by current consumption in the indication circuit and operating efficiency of the regulator falls, usable time of the device becomes shorter.

Another configuration is that the indication circuit is located between the battery and the regulator so as to be connected in parallel with the battery and also a switch element (e.g., NPN transistor, etc.) controlled by the micon is inserted in series into the indication circuit. The switch element is provided in order to completely extinguish a LED of the indication circuit. Because if the switch element is not added, a voltage (Vcc) applied to the control terminal on OFF is lower than a battery voltage of the battery and a potential difference applied to the indication circuit occurs. In order to omit the switch element, it is necessary to use a special micon with a control terminal to which a voltage equal to or more than the battery voltage is applied on OFF. Therefore, this configuration has a demerit that it is necessary to add the switch element or to use the special micon.

According to the second embodiment, since the battery 21 supplies current consumption in the indication circuit 23 (I23), current consumption in the regulator 22 (I22) is reduced by I23 in comparison with the above one configuration. Consequently, the regulator 22 can produce a constant voltage up to battery voltage lower than that of the prior art and the micon 20 can use the A/D converter up to battery voltage lower than that of the prior art.

Figure 3:
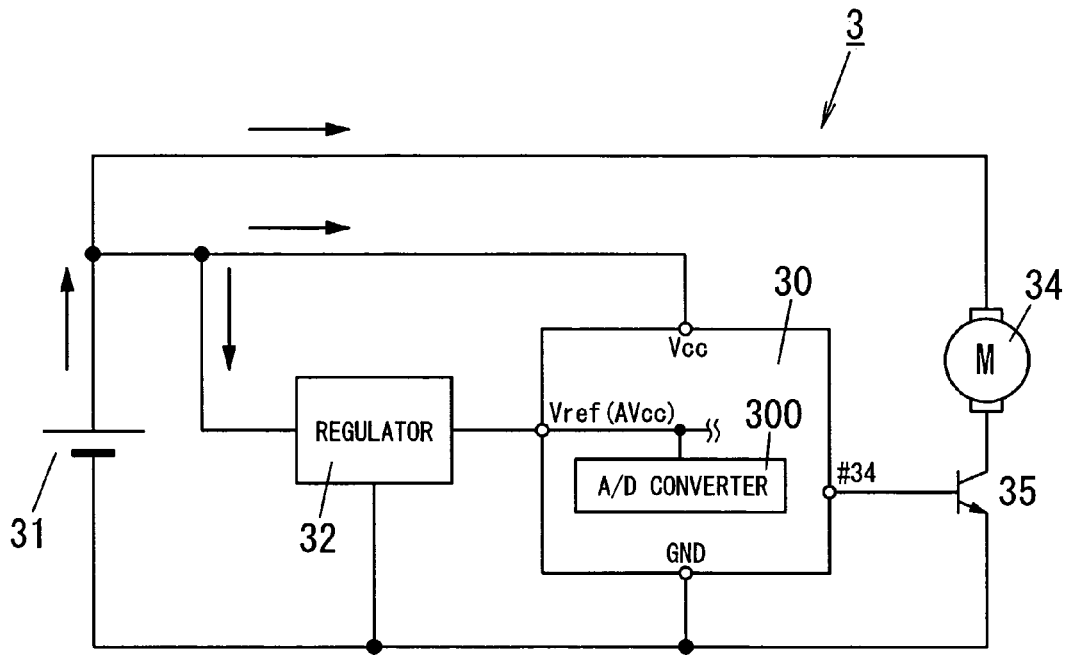
FIG. 3 is a schematic diagram of a battery-operated equipment of a third embodiment according to the invention.

FIG. 3 shows a battery-operated equipment 3 of a third embodiment according to the invention. As shown in FIG. 3, the battery-operated equipment 3 includes a micon 30, a battery 31 and a regulator 32 in almost the same way as those of the first embodiment, and further includes a motor 34 as a load and a switch element (e.g., NPN transistor, etc.) 35. In addition, a terminal #34 that turns ON (HIGH) and OFF (LOW) according to control of the micon 30 is selected from terminals of the micon 30, and the terminal #34 is used as a control terminal for controlling drive of the motor 34 through the switch element 35.

The motor 34 is connected in series with the switch element 35, while the series combination of the motor 34 and the switch element 35 is connected in parallel with the battery 31. A control terminal (base) of the switch element 35 is connected with the control terminal #34 of the micon 30. Accordingly, when the control terminal #34 is applied with a HIGH voltage to turn ON, the switch element 35 is turned on and then the motor 34 is driven. Inversely, when the terminal #34 is applied with a LOW voltage to turn OFF, the switch element 35 is turned off and then the motor 34 is stopped.

According to the third embodiment, since the motor 34 is connected with the battery 31 to use a battery voltage of the battery 31 as its power source voltage, the regulator 32 can produce a constant voltage up to a lower battery voltage and the micon 30 can use its A/D converter 300 up to a lower battery voltage. On account of this, even on the start of the motor 34 that brings about a large current and a battery voltage drop, the micon 30 can stably operate and use the A/D converter.

Figure 4:
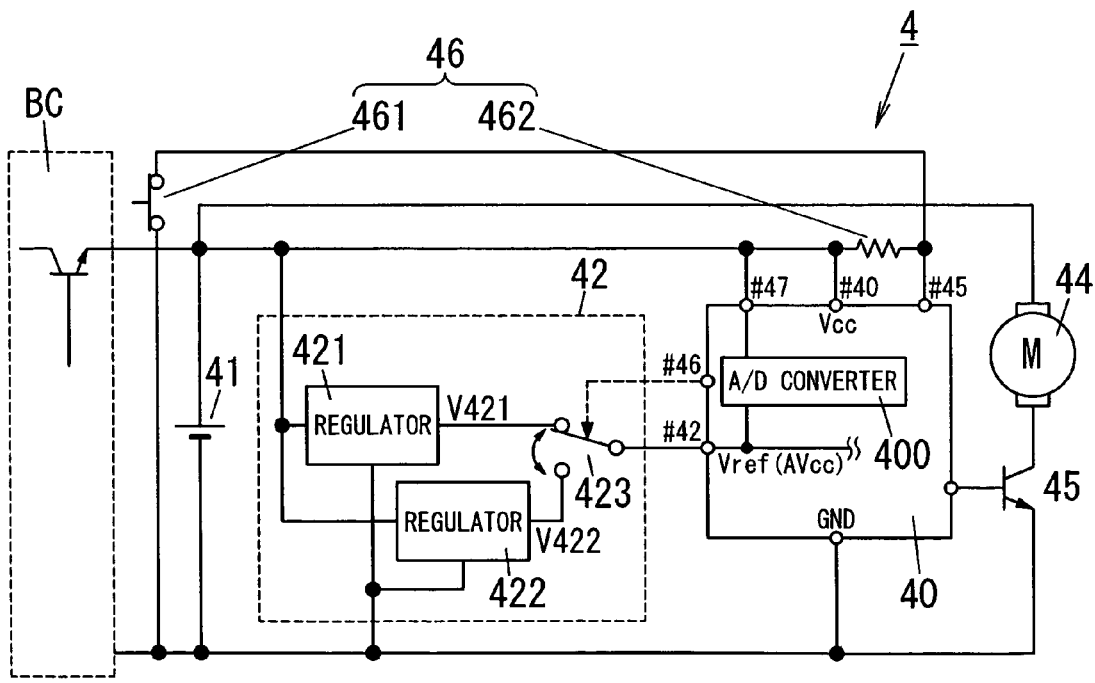
FIG. 4 is a schematic diagram of a battery-operated equipment of a fourth embodiment according to the invention.

FIG. 4 shows a battery-operated equipment 4 of a fourth embodiment according to the invention. As shown in FIG. 4, the battery-operated equipment 4 includes a micon 40, a battery 41, a motor 44 and a switch element 45 in almost the same way those of the third embodiment, and includes an additional connection detector 46 and a constant voltage power source 42 different from the regulator 32 of the third embodiment. The battery 41 is also a secondary battery (e.g., lithium-ion battery, etc.) that is (re)charged with a separate battery charger denoted by BC. BC is connected with one or more terminals (not shown) of the micon 40, and charges the battery based on information (e.g., battery voltage of battery 41, etc.) from the micon 40.

In addition, a terminal #45 for input of ON (e.g., LOW) or OFF (e.g., HIGH) signal is selected from terminals of the micon 40, and the terminal #45 is used as a terminal for input of detection result of the connection detector 46. A terminal #46 that turns ON (e.g., HIGH) and OFF (e.g., LOW) according to control of the micon 40 is selected from terminals of the micon 40, and the terminal #46 is used as a control terminal for controlling the constant voltage power source 42. An analog input terminal #47 of an A/D converter 400 within the micon 40 is selected from terminals of the micon 40, and the terminal #47 is connected with a positive terminal of the battery 41.

The connection detector 46 is configured to detect a connection with BC. For example, the connection detector 46 is constructed with a detection switch 461 of which one end and another end are respectively connected with the terminal #45 and a negative terminal of the battery 41, and a pull-up resistor 462 connected between the one end of the switch 461 and a power input terminal #40 applied with the battery voltage. Accordingly, when the switch 461 is turned on, the terminal #45 is supplied with a detection result (LOW) that represents a connection with BC. Inversely, when the switch 461 is turned off, the terminal #45 is supplied with a detection result (HIGH) that represents a disconnection with BC.

The constant voltage power source 42 is configured to increase and decrease a constant voltage as its output on charging and discharging of the battery 41, respectively. For example, the constant voltage power source 42 is constructed with a 3-terminal regulator 421 that derives a constant voltage V421 from the battery voltage, a 3-terminal regulator 422 that derives a constant voltage V422 (V421>V422) from the battery voltage, and a switch element 423. The switch element 423 applies the constant voltage V421 or the constant voltage V422 to a reference voltage input terminal #42 for an A/D converter 400 within the micon 40 according to a control signal from the control terminal #46. Concretely, when the detection result of the connection detector 46 is LOW, the micon 40 applies, for example, a HIGH voltage to the control terminal #46 and then the switch element 423 applies the constant voltage V421 to the reference voltage input terminal #42 in response to the HIGH voltage. Inversely, when the detection result is HIGH, the micon 40 applies, for example, a LOW voltage to the control terminal #46 and then the switch element 423 applies the constant voltage V422 to the terminal #42 in response to the LOW voltage.

On charging the battery 41, the battery voltage is low but the constant voltage V421 is applied to the reference voltage input terminal #42 so that a reference voltage of the A/D converter 400 is increased, and therefore precision of A/D conversion is raised and precise A/D conversion can be performed. Especially, since high detection precision of the battery voltage is required on charging the lithium-ion battery, the fourth embodiment is available. Also, on discharging of the battery that the battery voltage is enough high level, the constant voltage V421 is switched to the constant voltage V422 and therefore it is possible use the A/D converter 400 up to a lower battery voltage while maintaining the precision of A/D conversion.

In a modified embodiment, BC includes a battery charge control IC (integrated circuit) and so on, and detects a connection with the battery 41 by a battery voltage across the battery 41 or the like to charge the battery 41. In addition, the micon 40 determines charging and discharging states of the battery 41 based on, for example, charging indication output sent out from the battery charge control IC.

In another modified embodiment, the motor 44 is a stepping motor and the micon 40 includes a controller for the stepping motor. Terminals of the controller are connected with the stepping motor.

Figure 5:
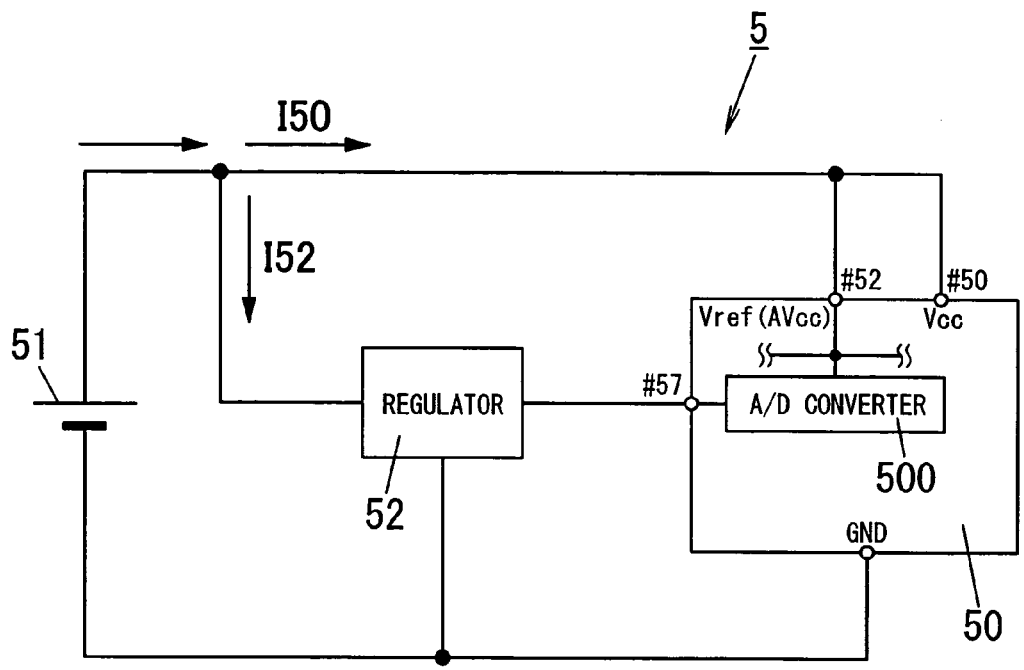
FIG. 5 is a schematic diagram of a battery-operated equipment of a fifth embodiment according to the invention.

FIG. 5 shows a battery-operated equipment 5 of a fifth embodiment according to the invention. As shown in FIG. 5, the battery-operated equipment 5 includes a micon 50, a battery 51 and a regulator 52 in almost the same way those of the first embodiment, and the micon 50 has an analog input terminal #57 of an A/D converter 500 as a specific terminal of terminals for the A/D converter 500 and also has a reference voltage input terminal #57 of the A/D converter 500 as another terminal. In addition, the A/D converter 500 is connected with a positive output terminal of the regulator 52 via the analog input terminal #57 to use a constant voltage of the regulator 52 as an input voltage for its A/D conversion and also connected with a positive terminal of the battery 51 via the reference voltage input terminal #52 to use a battery voltage of the battery 51 as a reference voltage for the A/D conversion. In FIG. 5, #50 is a power input terminal of the micon 50.

Figure 6:
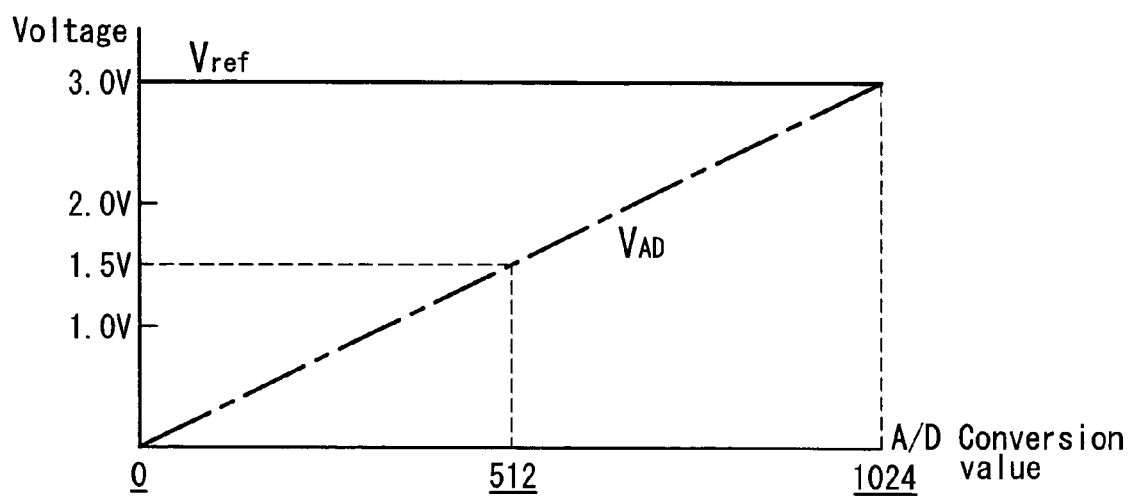
FIG. 6 is a characteristic example of an A/D converter in FIG. 1.

In FIG. 1, the A/D converter 100 is connected with the positive output terminal of the regulator 12 via the reference voltage input terminal #12, and converts an analog voltage applied to its analog input terminal (not shown) into a digital value while using the constant voltage V12 as the reference voltage Vref. This digital value (DV) is given by $$DV = (V_{AD}/V\mathrm{ref}) \times R,$$

where $V_{AD}$ is an analog voltage applied to the analog input terminal and R is resolution of the A/D conversion. For example, as shown in FIG. 6, the converter 100 provides DV (0, . . . , 512, . . . , 1024) linearly in response to $V_{AD}$ (0.0, . . . , 1.5, . . . , 3.0 [V]) when $V_{AD} \leq$ Vref, where R is 1024 (8-bit) and Vref is 3.0V.

Figure 7:
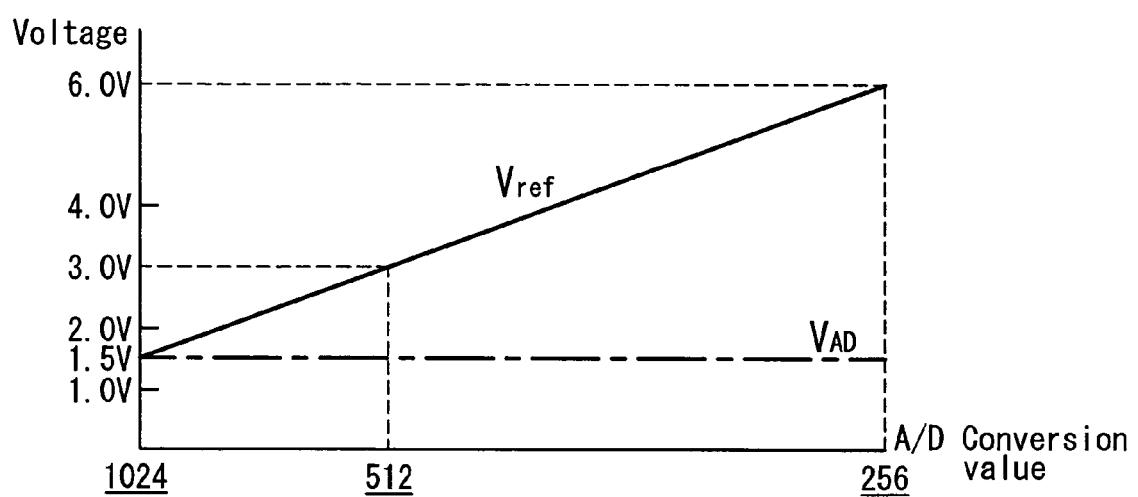
FIG. 7 is a characteristic example of an A/D converter in FIG. 5.

In the fifth embodiment, the converter 500 converts an analog voltage ($V_{AD}$) applied to the analog input terminal #57 into a digital value (DV) while using the battery voltage as the reference voltage Vref. For example, as shown in FIG. 7, the converter 500 provides DV (1024, . . . , 512, . . . , 256) non-linearly in response to Vref (1.5, . . . , 3.0, . . . , 6.0 [V]) when $V_{AD} \leq$ Vref, where R is 1024 (8-bit) and $V_{AD}$ is 1.5V.

According to the fifth embodiment, current consumption in the regulator 52 (I52) is reduced by current consumption in the micon 50 (I50) and therefore the regulator 52 can produce the constant voltage up to battery voltage lower than that of the prior art. As a result, the micon 50 can use the A/D converter 500 up to battery voltage lower than that of the prior art. Also, it is possible to obtain an A/D conversion value of the battery voltage from a difference between the battery voltage into the reference voltage input terminal #52 and the constant voltage into the analog input terminal #57.

Although the present invention has been described with reference to certain preferred embodiments, numerous modifications and variations can be made by those skilled in the art without departing from the true spirit and scope of this invention.

The invention claimed is:

1. A battery-operated equipment comprising:
   a battery;
   a constant voltage power source that derives a constant voltage from a battery voltage across said battery; and
   a microcomputer that incorporates at least an A/D converter and has terminals for the A/D converter and a power input terminal,
   said microcomputer being connected with said battery via said power input terminal to use said battery voltage as a power source voltage,
   said A/D converter being connected with said constant voltage power source via a specific terminal of said terminals for the A/D converter to use said constant voltage as a voltage for the A/D converter, and
   said A/D converter being connected with said constant voltage power source via a reference voltage input terminal of the A/D converter as said specific terminal to use said constant voltage as a reference voltage for the A/D conversion.

2. A battery-operated equipment, comprising:
   a battery;
   a constant voltage power source that derives a constant voltage from a battery voltage across said battery; and
   a microcomputer that incorporates at least and A/D converter and has terminals for the A/D converter and a power input terminal,
   said microcomputer being connected with said battery via said power input terminal to use said battery voltage as a power source voltage,
   said A/D converter being connected with said constant voltage power source via a specific terminal of said terminals for the A/D converter to use said constant voltage as a voltage for the A/D converter,
   wherein said microcomputer has an analog input terminal of said A/D converter as said specific terminal and also has a reference voltage input terminal of said A/D converter as another terminal of said terminals for the A/D converter; and
   said A/D converter is connected with said constant voltage power source via said analog input terminal to use said constant voltage as an input voltage for the A/D conversion and is also connected with said battery via said reference voltage input terminal to use said battery voltage as a reference voltage for the A/D conversion.

3. The battery-operated equipment of claim 1, further comprising an indication circuit that indicates operating state of said battery-operated equipment according to control of said microcomputer, wherein:
   said microcomputer further has a control terminal; and
   said indication circuit is connected with said control terminal to receive said control and also connected with said battery to use said battery voltage as the power source voltage.

4. The battery-operated equipment of claim 2, further comprising an indication circuit that indicates operating state of said battery-operated equipment according to control of said microcomputer, wherein:
   said microcomputer further has a control terminal; and
   said indication circuit is connected with said control terminal to receive said control and also connected with said battery to use said battery voltage as the power source voltage.

5. The battery-operated equipment of claim 1, further comprising a motor that is connected with said battery to use said battery voltage as the power source voltage of the motor.

6. The battery-operated equipment of claim 2, further comprising a motor that is connected with said battery to use said battery voltage as the power source voltage of the motor.

7. The battery-operated equipment of claim 1, wherein:
   said battery is a secondary battery; and
   said constant voltage power source increases and decreases said constant voltage on charging and discharging of said battery, respectively.

8. The battery-operated equipment of claim 2, wherein:
   said battery is a secondary battery; and
   said constant voltage power source increases and decreases said constant voltage on charging and discharging of said battery, respectively.

* * * * *